United States Patent [19]

Baudrant et al.

[11] Patent Number: 4,593,454
[45] Date of Patent: Jun. 10, 1986

[54] PROCESS FOR MANUFACTURING AN INTEGRATED CIRCUIT WITH TANTALUM SILICIDE CONNECTIONS UTILIZING SELF-ALIGNED OXIDATION

[75] Inventors: Annie Baudrant, St. Martin d'Heres; Michel Marty, Grenoble, both of France

[73] Assignee: Societe pour d'Etude et la Fabrication de Circuits Integres Speciaux EFCS, Grenoble, France

[21] Appl. No.: 673,425

[22] Filed: Nov. 20, 1984

[30] Foreign Application Priority Data

Nov. 22, 1983 [FR] France ............................. 83 18565

[51] Int. Cl.$^4$ .................. H01L 21/283; H01L 21/314
[52] U.S. Cl. ......................................... 29/571; 29/578; 29/591; 148/1.5; 148/187; 148/DIG. 19; 148/DIG. 147; 148/DIG. 20; 148/DIG. 117; 156/643; 156/653; 156/657; 357/23.1; 357/23.9; 357/67
[58] Field of Search .................... 29/571, 578, 591; 148/1.5, 187, DIG. 19, DIG. 147, DIG. 20, DIG. 117; 156/643, 653, 657; 357/67, 23.1, 23.9

[56] References Cited

U.S. PATENT DOCUMENTS

| 3,967,371 | 7/1976 | Croset et al. | 29/590 X |
| 3,986,896 | 10/1976 | Ueno et al. | 148/1.5 |
| 4,080,719 | 3/1978 | Wilting | 29/571 |
| 4,332,839 | 6/1982 | Levinstein et al. | 156/643 X |
| 4,384,301 | 5/1983 | Tasch et al. | 357/23.3 |
| 4,432,035 | 2/1984 | Hsieh et al. | 427/79 X |
| 4,471,524 | 9/1984 | Kinsbron et al. | 29/571 |
| 4,510,670 | 4/1985 | Schwabe et al. | 29/571 |

FOREIGN PATENT DOCUMENTS 0077200 4/1983 European Pat. Off. .
2092373 8/1982 United Kingdom .

OTHER PUBLICATIONS

Saraswat et al., "Thermal Oxidation of Tantalum Silicide in $O_2$ and $H_2O$" Appl. Phys. Lett., 41(12) 15 Dec. 1982, pp. 1127–1129.
Jones et al., "Salicide with Buried Silicide Layer" I.B.M. Tech. Discl. Bull., vol. 27, No. 2, Jul. 1984, pp. 1044–1045.

Primary Examiner—William G. Saba
Attorney, Agent, or Firm—Roland Plottel

[57] ABSTRACT

The invention concerns an integrated circuit the monocrystalline or polycrystalline silicon zones of which the source, gate and drain are covered with tantalum silicide $TaSi_2$ while the remainder of the slice is covered with portions of a layer of tantalum oxide $Ta_2O_5$, especially on the sides of the grids of polycrystalline silicon and on the thick oxide and an aluminum alloy layer comes into contact with the tantalum silicide to form connections with the portions of tantalum silicide.

9 Claims, 7 Drawing Figures

PROCESS FOR MANUFACTURING AN INTEGRATED CIRCUIT WITH TANTALUM SILICIDE CONNECTIONS UTILIZING SELF-ALIGNED OXIDATION

BACKGROUND OF THE INVENTION

The present invention concerns integrated circuits. The invention will be described in detail with respect to the manufacture of insulated gate field effect transistor circuits having a polycrystalline silicon gate insulated a thin layer of silicon oxide, but it can also be applied to other circuits, for example, bipolar transistor circuits.

DESCRIPTION OF THE PRIOR ART

In many integrated circuits, large zones of doped silicon act to conduct a non-negligible current and it is essential to reduce as much as possible the electric resistance of these zones. This is the reason why it has been proposed to form on these zones metal alloy layers, such as platinum, titanium, and tantalum silicide layers which have the advantage of a very high conductivity.

Platinum has the drawback of being very expensive; titanium "absorbs" a great amount of oxygen during the manufacturing phases which follow its deposit, which is prejudicial to its conductivity; furthermore, the silicides of these metals often have poor resistance to chemical agents; for example; titanium silicide is soluble in hydrofluoric acid HF which is frequently used to clean the slices. Tantalum and its silicide on the contrary have very good resistance to this type of chemical agent; unfortunately, they have proved very difficult to etch since, if etching is carried out with a plasma, the tantalum silicide that it is desired to preserve is attacked more rapidly than the tantalum that it is desired to eliminate; if, on the other hand, it is desired to etch by chemical means, baths at 80° C. are required that are difficult to utilize in mass production.

SUMMARY OF THE INVENTION

The present invention proposes an integrated circuit structure and a corresponding manufacturing process, this structure utilizing tantalum and thus making the most of its advantages without presenting its drawbacks; essentially, instead of trying to remove the tantalum where it is not desired or where it is not desired to mix it with the silicon, it is maintained in the form of insulating tantalum oxide; the circuit structure according to the invention is designed so that an unbroken layer containing tantalum is present along the whole slice, this layer being constituted by portions of a layer of tantalum silicide in direct contact with the silicon in certain zones and by portions of a layer of tantalum oxide in contact with the silicon oxide on the whole of the remainder of the slice.

More specifically, the integrated circuit according to the invention comprises monocrystalline and/or polycrystalline silicon zones, certain of which at least are connected to connections forming part of an interconnecting conductive layer; these zones are essentially completely covered with tantalum silicide and are separated from one another by portions of a tantalum oxide layer lying on an insulating oxide (generally silicon oxide), the interconnecting conductive layer being in contact with the tantalum silicide on one part of the thus covered silicon zones.

For field effect transistors having a polycrystalline silicon gate insulated by thin layer of silicon oxide, the areas of sources and drains of the transistors are covered with tantalum silicide, as well as the upper surface of the polycrystalline silicon gates; the sides of the gates are covered with a deposit of silicon oxide covered with tantalum oxide completely filling the spaces separating the tantalum silicide of the supplies and drains of the tantalum silicide of the grid.

The manufacturing process used to obtain this structure is the following:

on a slice are conventionally formed bare zones of silicon separated by zones where an insulator (silicon oxide) is present on the surface of the slice;

a layer of tantalum is uniformly deposited on the whole of the surface of the slice;

the slice is subjected to a temperature of about 750° C. in the presence of a neutral gas, preferably argon, in dry atmosphere, in order to form tantalum silicide everywhere the tantalum covers directly the bare silicon and in order to maintain the tantalum unconverted in sites where it covers the insulator (silicon oxide);

the slice is subjected to a temperature of about 200° to 500° C. in the presence of an oxidizing gas, preferably oxygen, in dry atmosphere, in order to oxidize the tantalum without oxidizing the tantalum silicide;

the manufacturing process is continued without eliminating the remaining tantalum oxide; especially, an insulating layer is deposited which is etched in order to open it above the portions of tantalum silicide zones, a metal layer (for example, an aluminum-silicon alloy) is deposited and then etched according to the interconnecting pattern selected.

The structure according to the invention has the advantage of eliminating any risk of short-circuiting through the formation of tantalum silicide or tantalum bridges between two zones of silicon which have to remain insulated, for example, between the gate and the source or the drain of a transistor. Furthermore, the tantalum silicide can cover very widely the silicon areas where it is desired to reduce the resistance, the limit of these areas being practically always determined by a silicon oxide zone that will delimit by self-alignment the separation between a tantalum silicide zone and a tantalum oxide zone.

In the manufacturing process, no masking stage will be necessary in order to define the tantalum silicide zones and therefore no difficulty will be encountered for patterning the tantalum or tantalum silicide.

In particular, prior to the tantalum deposit, silicon oxide will be deposited by decomposition in a gaseous phase, an oxide that will can be etched uniformly according to an anisotropic vertical attack until the underlying monocrystalline and polycrystalline silicon are exposed bare, while preserving along the length of the sides of the polycrystalline silicon gates insulating oxide deposits that will prevent any formation of silicide on these sides.

BRIEF DESCRIPTION OF THE DRAWING

Other features and advantages of the invention will become apparent from reading through the following detailed description given with reference to the appended drawings in which.

DESCRIPTION OF THE PREFERRED EMBODIMENTS

Figure 1:
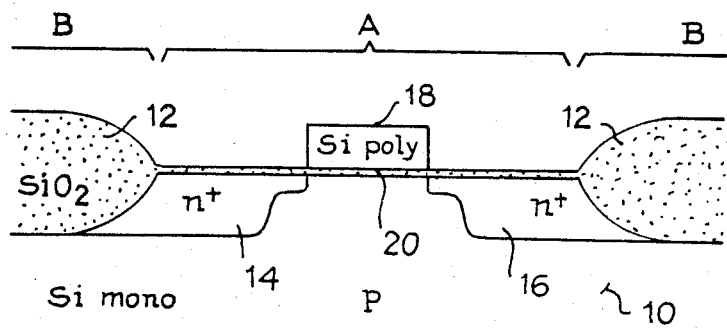
FIGS. 1 to 7 represent the the product at successive steps of the process for producing an integrated circuit according to the invention, incorporating field effect transistors.

The conventional steps of producing the transistors itself will not be described in detail; in an initial monocrystalline silicon slice 10 active zones A are defined, insulated from one another by thick silicon oxide zones B 12 (FIG. 1). Implantations and diffusions of source 14 and drain 16 are carried out after having deposited and patterned a polycrystalline silicon layer defining especially the gates 18 of the transistors, these gates lying over a thin silicon oxide gate layer 20. The gate acts as implantation mask during a source and drain implantation step. Generally, additionally, a source and drain deep diffusion step is performed and this is the reason why in FIG. 1 source and drain areas have been represented in the form of stairs with a shallow region self-aligned with the edge of the gate and a deep diffusion in the rest of the active zone A outside the gate and its immediate edges.

Several manufacturing processes are known and it will thus be considered that there is no difficulty for the man skilled in the art of obtaining the structure of FIG. 1 or other MOS technology or bipolar structures for which the invention can be useful.

In the initial structure of FIG. 1, it is desired that the source and drain diffusion, that can interconnect several transistors, as well as polycrystalline gates, have as low a resistance as possible (this is furthermore one of the reasons for the existence of source and drain deep diffusions).

Figure 7:
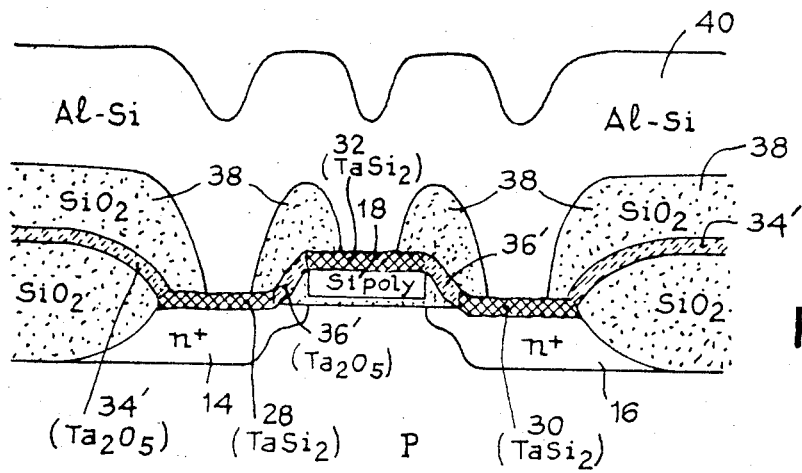

To do this, the invention proposes realizing a structure the final form of which is represented in FIG. 7 and which will be achieved in the following way.

Figure 2:
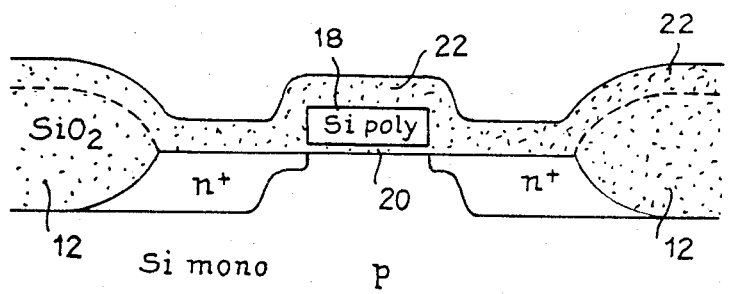

Firstly, a silicon oxide layer 22 is deposited by chemical decomposition in gaseous phase at low pressure. The covering power of this deposit is high so that the layer is rounded about the edges of the gate and largely fills the right angle formed by the sides of the gate 18 and the monocrystalline silicon surface 10 (FIG. 2).

Figure 3:
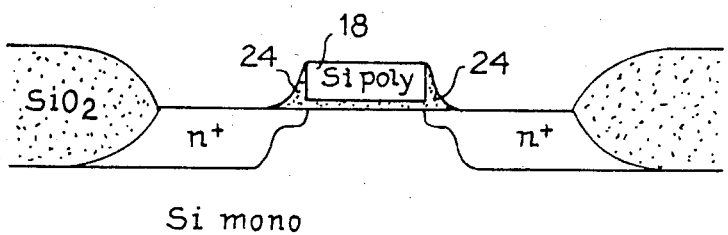

The silicon oxide present is then uniformly etched, and this etching is carried out by vertical anisotropic attack. The engraving is interrupted when the monocrystalline silicon as well as the polycrystalline silicon of the gate are exposed bare. The etching is not continued, so that there remains, due to the anisotropy of the etching, deposits 24 of silicon oxide covering the sides of the gate 18 and filling the corner formed by the side of the gate and the surface of the monocrystalline silicon of the slice. The etching is, for example, a reactive ionic plasma etching that can be followed by stripping with SF6 plasma, performed in the same chamber which will be used for the following tantalum deposition step (two chamber housing), in such a way as to clean thoroughly the monocrystalline and polycrystalline silicon without subjecting it again thereafter to an oxidizing atmosphere (FIG. 3).

Figure 4:
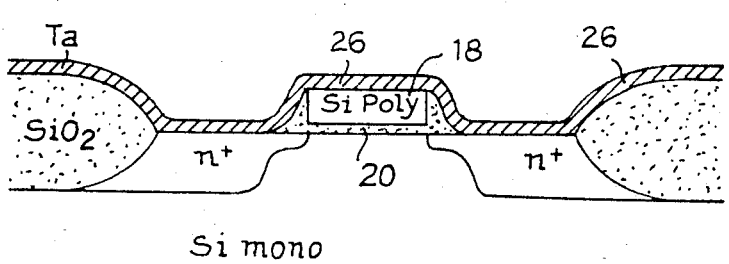

A uniform layer 26 of tantalum having a thickness that can be about 600 angströms is then deposited in any suitable known manner, for example, by evaporation or sputtering in the chamber used for the previous etching. The covering power is equally sufficient for the deposited tantalum layer not to be subject to any discontinuity at the steps constituted by the polycrystalline silicon gates (FIG. 4).

In a usual silicide formation processes, it would be necessary to etch the deposited metal in order to separate the metal covering the gate from the metal covering the source and from the metal covering the drain.

Figure 5:
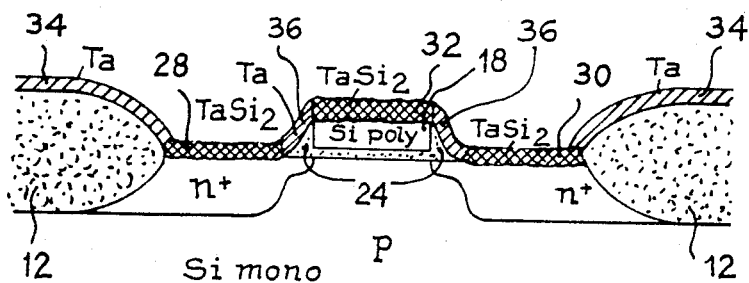

Then, in the instant process, the slice is subjected to a temperature of about 750° C. for a period of about 30 minutes in a dry atmosphere, in the presence of a neutral gas, preferably argon. A layer of tantalum silicide $TaSi_2$ is thus formed in the sites where the tantalum is directly in contact with the monocrystalline silicon (zones 28 and 30 above the source and the drain) or with the polycrystalline silicon (zone 32 above the gate) but the tantalum does not react with the silicon in the sites where it lies on the silicon oxide, namely both in the regions 34 covering the thick oxide 12 and in the regions 36 above the silicon oxide side deposits 24 (FIG. 5).

There is now a short-circuit between the sources, drains and gates of the transistors through the intermediary of the tantalum in regions 34 and 36 overlaying the edge deposits, but already the tantalum silicide zones are differentiated from the pure tantalum zones and has been done in a self-aligning manner, i.e. without a masking step; the silicide is truly formed over the entire silicon portion which has been exposed bare at the step of FIG. 3.

It is necessary to eliminate the short-circuits formed by the pure tantalum of regions 34 and 36 but, if etching by plasma is attempted, the $TaSi_2$ alloy is attacked more rapidly than the pure tantalum. A chemical etching is possible to eliminate solely the pure tantalum but it would necessitate a bath at 80° C. which is impractical for in mass production.

Rather than using such an etching, the slice is subjected to an oxidation at low temperature (between 200° C. and 500° C.), in dry atmosphere, for example, in the presence of dry oxygen, so as to pure tantalum without oxidizing the tantalum silicon. At this temperature, this step is totally inert with respect to the constituents other than the pure tantalum.

Figure 6:
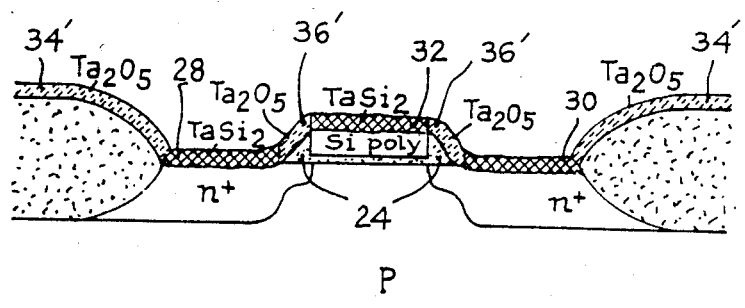

The duration of the oxidation typically is about one hour so as to transform completely the thickness of the tantalum of regions 34 and 36 into tantalum oxide $Ta_2O_5$ (regions 34' and 36'). The tantalum oxide is a very good insulator (FIG. 6).

Without need to etch the tantalum oxide or the tantalum silicide, the process continues with the step of depositing over the whole at low temperature a thick silicon oxide layer (about 6000 Angstroms.) This layer is then etched in the usual fashion openings for use as contact points on portions of the tantalum silicide layers. A metallic interconnecting layer is then deposited over the whole which can be an aluminum based alloy, for example Al-Si or Al-Si-Cu or Al-Ta (FIG. 7).

This layer is then etched to leave the the desired interconnecting pattern, the surface of the substrate is passivated and contact pads are opened for bonding wires to the housing of the circuit (steps non represented). These may all be done in the usual fashion.

Therefore, in the structure of the integrated circuit according to the invention, shown in FIG. 7 at its almost final stage, all the zones of monocrystalline or polycrystalline silicon that are not covered directly by the silicon oxide are completely covered with tantalum silicide; this is the case of the largest part of the source and drain zones; this is also the case for the whole of the upper face of the gate, these zones of silicon covered with tantalum oxide silicide are separated by unbroken or continuous portions of a tantalum layer lying over silicon oxide; this is the case, above the thick field oxide which separates the transistors, this is also the case between the source and the gate or between the drain and the gate of a single transistor. An interconnecting conductive layer comes locally by way of openings in an insulating layer into contact with the tantalum silicide on portions of the silicon zones covered with tantalum silicide. It is possible to envisage the interconnecting conductive layer being constituted not by an aluminum alloy, but, for example, by polycrystalline silicon which itself can be alloyed in the form of silicide to another metal deposited on this polycrystalline silicon, thus constituting a first inerconnecting level over which it is eventually possible to form other interconnecting levels.

It should be understood that the present invention is even applicable to integrated circuits formed on substrates other than silicon (insulating substrates or substrates of another semiconductor).

We claim:

1. Process for manufacturing an integrated circuit comprising the following operations:
    forming conventionally on a silicon slice base zones separated by zones where an insulator is present on the surface of the slice;
    depositing a layer of tantalum uniformly on the whole of the surface of the slice;
    subjecting the slice to a temperature of about 750° C. in the presence of a neutral gas, preferably argon, in dry atmosphere, in order to form thereby tantalum silicide throughout where the tantalum covers directly the silicon and in order to preserve tantalum where it covers the insulator (silicon oxide);
    subjecting the slice to a temperature of about 200° C. in the presence of an oxidizing gas, preferably oxygen, in dry atmosphere, in order to oxidize the tantalum without oxidizing the tantalum silicide;
    continuing the manufacturing process without eliminating the remaining tantalum oxide.

2. Manufacturing process according to claim 1, wherein, prior to the deposit of the tantalum, field effect transistors are formed with polycrystalline silicon grid insulated from the substrate by a thin silicon oxide layer, the slice is covered by a layer of silicon oxide deposited by chemical decomposition in gaseous phase, and this layer is uniformly removed by vertical anisotropic attack until the polycrystalline silicon of the grid and the monocrystalline on either side of the grid are exposed, the anisotropic attack allowing a silicon oxide deposit to remain along the length of the sides of the grid.

3. Manufacturing process according to one of claims 1, wherein, after formation of tantalum oxide, the slice is covered with thick silicon oxide that is selectively attacked above portions of tantalum silicon zones, then a metallic layer is deposited that is engraved according to a selected interconnecting pattern.

4. A process for manufacturing an integrated circuit which includes the steps of
    preparing a semiconductor slice which includes at a top surface a plurality of spaced zones of silicon associated with silicon transistors and regions of silicon oxide between said spaced zones of silicon;
    depositing a layer of tantalum uniformly over said top surface of the slice;
    heating the slice at a temperature, in an non-oxidizing atmosphere and for a time to convert the tantalum overlying the zones of silicon to tantalum silicide and leaving unconverted the tantalum overlying the silicon oxide regions;
    heating the slice in an oxidizing atmosphere for a time and at a temperature to oxidize the tantalum overlying the silicon oxide regions without oxidizing the tantalum silicide.

5. The process of claim 4 further characterized in that the spaced zones of silicon include the source, drain and insulated gate zones of silicon insulated-gate field effect transistors and the regions of silicon oxide includes the field oxide regions separating transistors and a layer on the side walls of the gate zone.

6. The process of claim 5 in which the layer of silicon oxide on the side walls of the gate zones is previously formed by covering the top surface of the slice with a layer of silicon oxide and exposing the slice to an isotropic etching for removing the silicon oxide for exposing the silicon over the source, drain and gate zones while leaving a layer over the side walls of the gate zones.

7. The process of claim 4 in which the step of converting portions of the layer of tantalum to tantalum silicide involves heating the slice to about 750° C. in an argon atmosphere.

8. The process of claim 7 in which the step of converting portions of the layer of tantalum to tantalum oxide involves heating the slice to about 200° C. in a dry oxygen atmosphere.

9. The process of claim 4 in which after formation of the tantalum oxide an aluminum rich layer is deposited and patterned to form connections to the tantalum silicide portions.

* * * * *